United States Patent
Lee et al.

(10) Patent No.: US 9,508,408 B2
(45) Date of Patent: Nov. 29, 2016

(54) ADJUSTMENT OF WRITE TIMING IN A MEMORY DEVICE

(71) Applicant: Advanced Micro Devices, Inc., Sunnyvale, CA (US)

(72) Inventors: Ming-Ju Edward Lee, San Jose, CA (US); Shadi M. Barakat, San Mateo, CA (US); Warren Fritz Kruger, Sunnyvale, CA (US); Xiaoling Xu, Cupertino, CA (US); Toan Duc Pham, San Jose, CA (US); Aaron John Nygren, San Francisco, CA (US)

(73) Assignee: ADVANCED MICRO DEVICES, INC., Sunnyvale, CA (US)

( * ) Notice: Subject to any disclaimer, the term of this patent is extended or adjusted under 35 U.S.C. 154(b) by 121 days.

(21) Appl. No.: 14/243,283

(22) Filed: Apr. 2, 2014

(65) Prior Publication Data
US 2014/0211571 A1    Jul. 31, 2014

Related U.S. Application Data

(62) Division of application No. 12/490,454, filed on Jun. 24, 2009, now Pat. No. 8,730,758.

(51) Int. Cl.
| G11C 7/00 | (2006.01) |
| G11C 7/22 | (2006.01) |
| G06F 13/16 | (2006.01) |
| G06F 13/42 | (2006.01) |
| G11C 11/4076 | (2006.01) |

(52) U.S. Cl.
CPC ............. *G11C 7/22* (2013.01); *G06F 13/1689* (2013.01); *G06F 13/4234* (2013.01); *G11C 7/222* (2013.01); *G11C 11/4076* (2013.01)

(58) Field of Classification Search
None
See application file for complete search history.

(56) References Cited

U.S. PATENT DOCUMENTS

| 7,155,627 B2 | 12/2006 | Matsui |
| 7,187,598 B1 | 3/2007 | Daugherty et al. |
| 7,209,396 B2 | 4/2007 | Schnell |
| 7,902,887 B2 | 3/2011 | Bae et al. |
| 8,730,758 B2 | 5/2014 | Lee et al. |
| 2006/0090054 A1 | 4/2006 | Choi et al. |
| 2010/0188910 A1* | 7/2010 | Kizer .................. G11C 7/1051 365/193 |

FOREIGN PATENT DOCUMENTS

| JP | H11-7335 | 1/1999 |
| JP | 2008-226374 | 9/2008 |
| WO | WO 2005/072355 A2 | 8/2005 |

OTHER PUBLICATIONS

Combined International Search Report and Written Opinion, International Appln. No. PCT/US2010/033889, International Filing Date, May 6, 2010, mailed Sep. 6, 2010, 11 pages.
Office Action dispatched Apr. 2, 2014, in Japanese Patent Application No. 2012-517529, Mr. Hayakawa Yuji et al., drafted Mar. 5, 2014 with English language translation.
English language abstract of Japanese Patent No. JP H11-7335 European Patent Office, espacenet database—Worldwide.
English language abstract of Japanese Patent No. JP 2008-226374 European Patent Office, espacenet database—Worldwide.

* cited by examiner

*Primary Examiner* — Kretelia Graham
(74) *Attorney, Agent, or Firm* — Volpe and Koenig, P.C.

(57) ABSTRACT

A method and system are provided for adjusting a write timing in a memory device. For instance, the method can include receiving a data signal, a write clock signal, and a reference signal. The method can also include detecting a phase shift in the reference signal over time. The phase shift of the reference signal can be used to adjust a phase difference between the data signal and the write clock signal, where the memory device recovers data from the data signal based on an adjusted write timing of the data signal and the write clock signal.

6 Claims, 9 Drawing Sheets

ADJUSTMENT OF WRITE TIMING IN A MEMORY DEVICE

CROSS-REFERENCE TO RELATED APPLICATIONS

This application is a divisional of U.S. patent application Ser. No. 12/490,454 filed Jun. 24, 2009, now allowed, which is hereby incorporated herein by reference in its entirety.

BACKGROUND

Field

Embodiments of the present invention generally relate to an adjustment of a write timing in a memory device. More specifically, embodiments of the present invention refer to adjusting the write timing of the memory device based on a reference signal.

Background

Data communication between a processing unit and a memory device typically involves sending data along signal paths such as, for example, wires and traces, in a memory device with a synchronous interface, the processing unit may transmit a clock signal along with the data signal to the memory device. The clock signal is used to determine when the data signal should be latched by the. memory device, thus synchronizing the memory device to the processing unit. For proper data recovery, the memory device must receive the clock signal within as time period that allows the clock signal to sample the data signal (e.g., the clock signal must sample the data signal within a period of time corresponding to a data eye of the data signal). Otherwise, the memory device may not recover the correct data value.

Real-world variations, such as temperature and jitter, can cause attenuation in the transmitted data signal and clock signal from the processing unit to the memory device, thus causing a loss in data signal integrity. This can result in poor or inaccurate data recovery by the memory device. As operating frequencies in computer systems increase, a need arises to transmit data more rapidly from the processing unit to the memory device, Accordingly, the memory device not only needs to sample data at a faster rate, but also needs to sample the data at the proper time.

SUMMARY

Embodiments of the present invention include a method for adjusting a write timing in a memory device, The method can include receiving a data signal, at write dock signal, and a reference signal. The reference signal can have a phase shift of one-half unit interval with respect to the data signal. The method can also include detecting, a phase shift in the reference signal, where the phase shift can he detected based on an edge transition in the reference signal. The phase of the reference signal can be computed based on the detection of one or more edge transitions, where the phase of the reference signal can shift over time. Further, the method can also include adjusting a phase difference between the data signal and the write clock signal based on the phase shift of the reference signal, where the memory device recovers data from the data signal based on an adjusted write timing of the data signal and the write clock.

Embodiments of the present invention further include another method for adjusting a write timing in a memory device. The method can include the following: sending a data signal, a write clock signal, and a reference signal to the memory device., and, adjusting a phase difference between the data signal and the write clock signal based on a phase shift in the reference signal.

Embodiments of the present invention also include a system configured to adjust a write timing in a memory device. The system can include the following-, a processing unit configured to transmit a data signal, a write clock signal, and a reference signal; and, a memory device configured to recover data from the data signal based on a write timing of the data signal and the write clock signal and to adjust a phase difference between the data signal and the write clock signal based on a phase shift in the reference signal.

Embodiments of the present invention further include another system configured to adjust a write timing in a memory device. The system can include the following: a memory device configured to receive a data signal, a write clock signal, and a reference signal and to recover data from the data signal based on a write timing of the data signal and the write clock signal; and a processing, unit configured to transmit the data signal, write, clock signal, and reference signal to the memory device and to adjust a phase difference between the data signal and the write clock signal based on a phase shift in the reference signal.

Embodiments of the present invention further include another system configured to adjust a write timing in a memory device. The system can include the following: a processing unit configured to transmit a data signal, a write clock signal, and a reference signal; and a memory device configured to recover data from the data signal based on a write timing of the data signal and the write clock signal and to transmit information, corresponding to a phase difference between the data signal and the write clock signal based on a phase shift in the reference signal, to the processing unit. The processing unit can also be configured to adjust a phase difference between the data signal and the write clock signal based on the information transmitted from the memory device.

Further features and advantages of the invention, as well as the structure and operation of various embodiments of the present invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art based on the teachings contained herein.

BRIEF DESCRIPTION OF THE DRAWINGS

The accompanying drawings, which are incorporated herein and form a part of the specification, illustrate embodiments of the present invention and, together with the description, further serve to explain the principles of the invention and to enable a person ski lied in the relevant art to make and use the invention.

DETAILED DESCRIPTION

The following detailed description refers to the accompanying drawings that illustrate exemplary embodiments consistent with this invention. Other embodiments are possible, and modifications can be made to the embodiments within the spirit and scope of the invention. Therefore, the detailed description is not meant to limit the invention. Rather, the scope of the invention is defined by the appended claims.

It would be apparent to one of skill in the an that the present invention, as described below, can be implemented in many different embodiments of software, hardware, firmware, and/or the entities illustrated in the figures. Thus, the operational behavior of embodiments of the present invention will be described with the understanding that modifications and variations of the embodiments are possible, given the level of detail presented herein.

Figure 1:
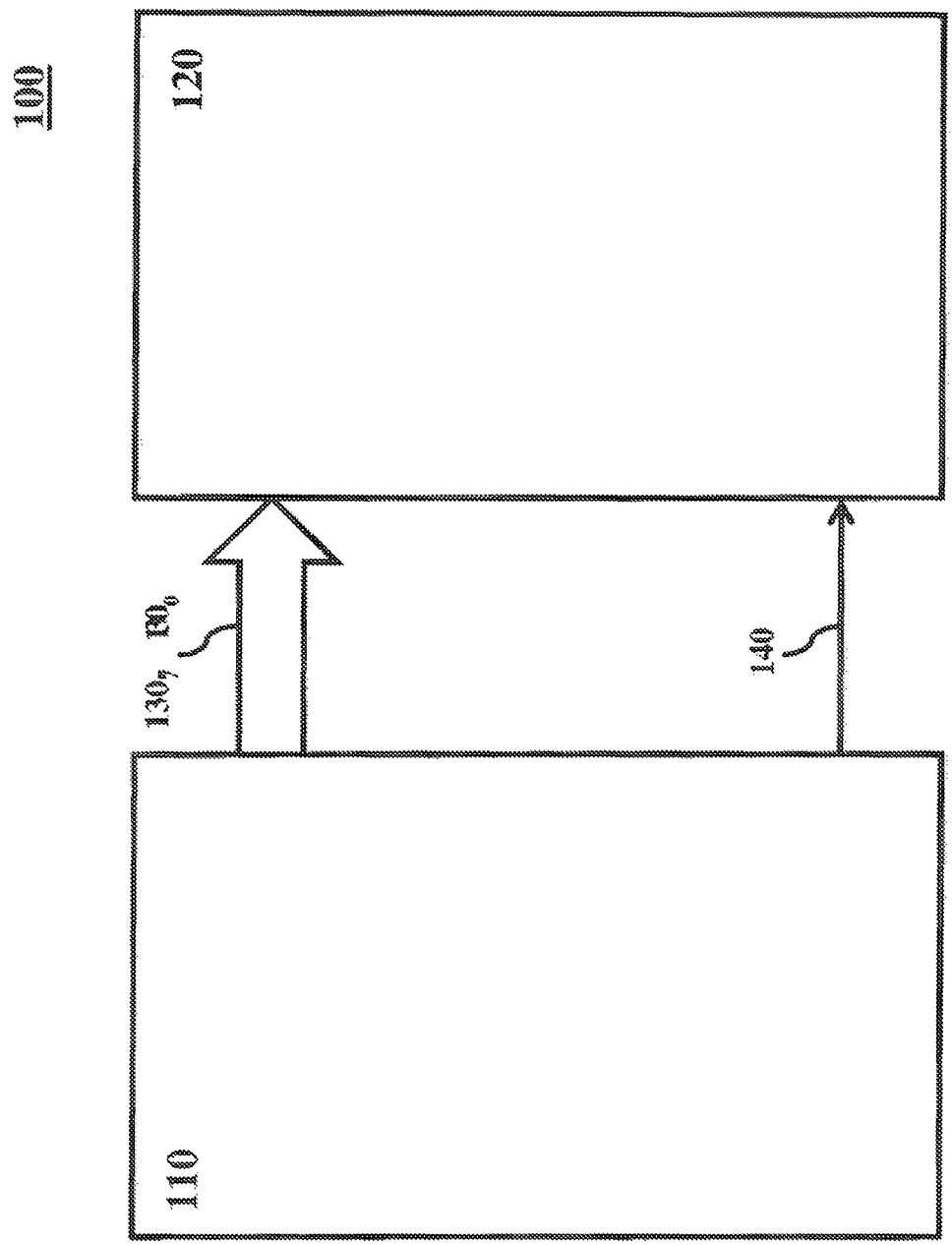
FIG. 1 is an illustration of an exemplary computer system with a processing unit and a memory device.

FIG. 1 is an illustration of an exemplary computer system 100 with a processing unit and a memory device. Computer system 100 includes a processing unit 110, a memory device 120, a data bus 130$_7$-130$_0$, and a dock 140 (e.g., a write clock), Processing unit 110 transmits data, via data bus 130$_7$-130$_0$, to memory device 120, Processing unit 110 can be, for example, a central processing unit (CPU), a graphics processing unit (GPU), or a memory controller. For example purposes, data bus 130$_7$-130$_0$ is illustrated as an 8-bit data bus. Based on the description herein, a person do in the relevant art will recognize that the bus width of data bus 130$_7$-130$_0$ can vary (e.g., 16-bits, 32-bits, etc.).

Memory device 120 stores the data transmitted from processing unit 110. The receipt and storage of data (transmitted from processing unit 110) is known as "writing" to memory device 120. Memory device 120 can be configured with a synchronous interface, in which memory device 120 waits for write dock 140 before processing the data on data bus 130$_7$-130$_0$. For instance, memory device 120 can generate an internal clock signal, aligned with the received write clock 140, to extract the data from data bus 130$_7$-130$_0$.

Figure 2:
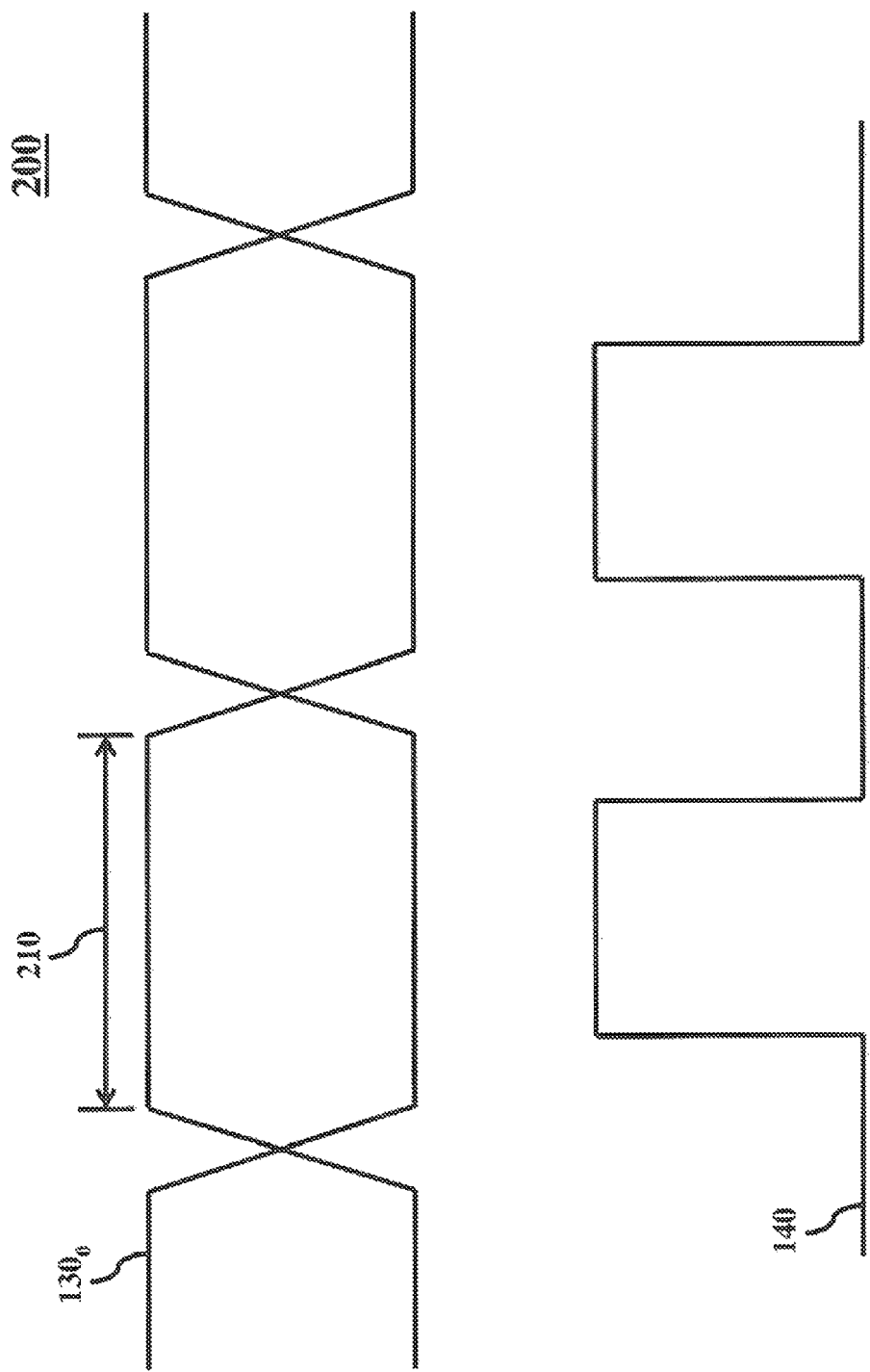
FIG. 2 is an illustration of an exemplary write timing diagram that is representative of proper data recovery by a memory device.

FIG. 2 is an illustration of an exemplary write timing diagram 200 for computer system 100 that is representative of proper data recovery by memory device 120. Write timing diagram 200 includes timings for as data eye for data signal 130$_0$ and write dock 140, where the data eye defines a period of time 210 in which write dock 140 can be used to sample data signal 130$_0$ (e.g., proper data recovery by memory device 120 can occur within period of time 210). A data eye refers to, for example, a portion of data signal 130$_0$ with a valid binary value. Here, write clock. 140 is center aligned to data signal 130$_0$ and samples data signal 130$_0$ within the data eye when write clock 140 is HIGH (or has a logic value of "1").

Figure 3:
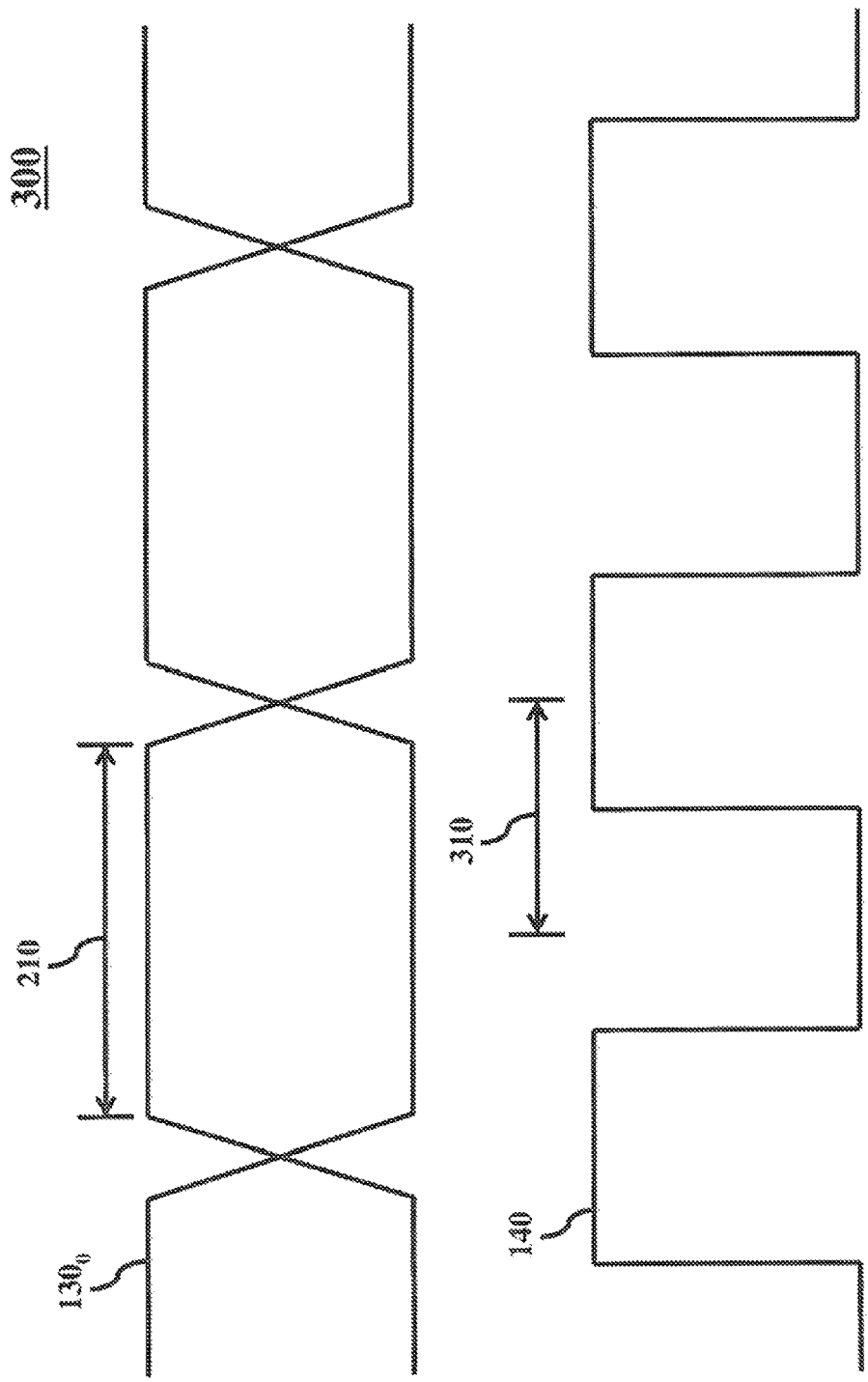
FIG. 3 is an illustration of an exemplary write timing diagram that is not representative of proper data recovery by a memory device.

FIG. 3 is an illustration of an exemplary write timing diagram 300 for computer system 100 that is not representative of proper data recovery by memory device 120. Similar to write timing diagram 200, write timing diagram 300 includes timings for the data eve of data signal 130$_0$ and write clock 140. However, write clock 140 has a relative phase difference 310 (or timing skew) with respect to data signal 130$_0$, where phase difference 310 may not provide memory device 120 a sufficient amount of time to sample data signal 130$_0$ (e.g., a sufficient amount of time for memory device 120 to latch data signal 130$_0$). Variations in relative phase difference 310 between data signal 130$_0$ and write clock 140 can be caused by various factors such as, for example, temperature and jitter in computer system 100. In exemplary write timing diagram 300, relative phase difference 310 can be defined by as difference between as center of data eye 210 and a center of write clock 140 when write clock 140 samples data signal 130$_0$ (e.g., when write clock 140 is HIGH or has a logic value of "1").

As the operating frequency of computer system 100 increases, memory device 120 not only needs to sample data bus, 130$_7$-130$_0$ at a faster frequency, but also needs to sample the data at the proper time. Write clock 140 should be optimally aligned with data bus 130$_7$-130$_0$ to ensure proper sampling of the data. To align write dock 140 with the data bus 130$_7$-130$_0$, an additional signal can be implemented in computer system 100 to adjust the relative phase difference or timing skew) between data bus 130$_7$-130$_0$ and write clock 140 such that memory device 120 properly recovers data transmitted from processing unit 110.

Figure 4:
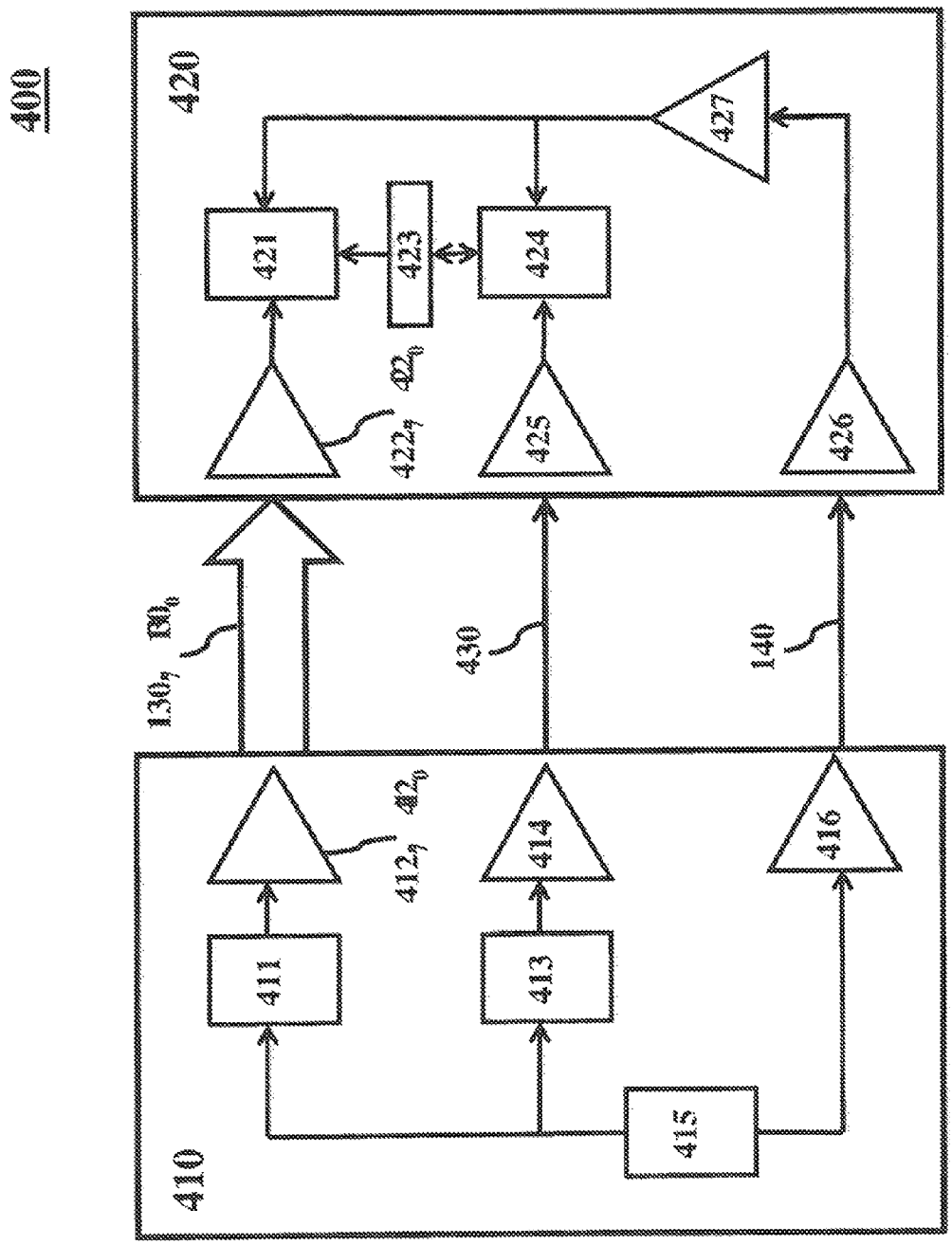
FIG. 4 is an illustration or an embodiment of a computer system configured to adjust a write timing in a memory device.

FIG. 4 is an illustration of an embodiment of a computer system 400 configured to adjust a write timing in a memory device. Computer system 400 includes a processing unit 410 (e.g., a CPU, GPU, northbridge device, etc.), a memory device 420, a reference signal 430, data bus 130$_7$-130$_0$, and write clock 140. In an embodiment, processing unit 410 and memory device 420 are integrated circuit (IC) devices on a circuit board with reference signal 430, data bus 130$_7$-130$_0$, and write clock 140 communicatively coupling the two IC device, where reference signal 430, data bus 130$_7$-130$_0$, and write clock 140 can be wires, interconnects, or circuit board traces. In another embodiment, processing unit 410 and memory device 420 are integrated on a single IC device with reference signal 430, data bus 130$_7$-130$_0$, and write clock 140 communicatively coupling processing unit 410 to memory device 420.

Data bus 130$_7$-130$_0$ and write clock 140 are connected to input/output (I/O) ports of processing, unit 410 and memory device 420 that are used to write data to memory device 420. I/O ports that connect a processing unit to a memory device (e.g., DQ and write clock pins) are known to those skilled in the relevant art. In an embodiment, reference signal 430 can be connected to either a new or existing I/O port in processing unit 410 and to either a new or existing corresponding I/O) port in memory device 420 to perform the functions described below. As described further below, reference signal 430 can be a unidirectional or a bidirectional signal according to an embodiment of the present invention.

In it further embodiment, reference signal 430 can be connected to an existing I/O port m processing unit 410 and to an existing corresponding I/O port in memory device 420, where the existing I/O ports in processing unit 410 and memory device 420 can be used for more than one functions. For instance, in a non-write mode of operation, the existing I/O ports can be used to implement an existing function of processing unit 410 and memory device 420. In a write mode of operation. the 110 ports can be used to communicate reference signal 430 between processing unit 410 and memory device 420, as described further below. Based on the description herein, a person skilled in the relevant art will recognize that reference signal 430 can be connected to any combination of new or existing I/O ports in processing unit 410 and memory device 420.

In an embodiment, processing unit 410 is a GPU. Alternatively, in another embodiment, processing unit can be a CPU or a memory controller. Processing unit 410 includes phase interpolators 411 and 413, data buffers $412_7$-$412_0$, signal buffer 414, clock buffer 416, and a phase locked loop (PLL) 415. Phase interpolators 411 and 413 introduce predetermined phases into data bus $130_7$-$130_0$ reference signal 430, respectively, based on a clock output from PLL 415. The clock output of PLL 415 is also used to generate write clock 140. Additionally, data buffers $412_7$-$412_0$, signal buffer 414, and Clock buffer 416 drive data bus $130_7$-$130_0$, reference signal 430, and write clock 140, respectively, from processing unit 410 to memory device 420. Phase interpolators, PLLs, and buffers are known to those skilled in the relevant art.

Based on the description herein, a person skilled in the relevant an will recognize that embodiments of the present invention can be implemented with other types of processing units, which are within the scope and spirit of the present invention. Further, is person skilled in the relevant art will recognize that the number of data buffers $412_7$-$412_0$ is based on the size of the data bus, where the number of data buffers can vary according to the size of the data bus.

In reference to FIG. 4, in an embodiment, memory device 420 is a dynamic random access memory (DRAM) device. Memory device 420 includes phase interpolators 421 and 424, data buffers $422_7$-$422_0$, signal buffer 425, clock buffer 426, a Otter 423, and a buffer 427. Data buffers $422_7$-$422_0$, signal buffer 425, and clock buffer 426 receive data bus $130_7$-$130_0$, reference signal 430, and write clock 140, respectively, from processing unit 410 and regenerate (e.g., amplify) the received signals to valid voltage potentials. The received signals may suffer from signal attenuation or data integrity loss when traversing along their respective signal paths from processing unit 410 to memory device 420. Buffer 427 drives the buffered output from clock butler 426 to phase interpolators 421 and 424. The buffered outputs from data buffers $422_7$-422 and signal buffer 425 are also fed into phase interpolators 421 and 424, respectively.

Based on the description herein, a person skilled in the relevant art will recognize that embodiments of the present invention can be implemented with other types of memory devices. These other types of memory devices are within the scope and spirit of the present invention.

In an embodiment, during a wile operation, data bus $130_7$-$130_0$ carries the data to be written to memory device 420, while write clock 140 and reference signal 430 are used by memory device 420 to synchronize sampling of data bus $130_7$-$130_0$. To facilitate in the explanation of the write timing in memory device 420, data bus $130_7$-$130_0$. Write clock 140, and reference signal 430 will be defined. Further, for ease of explanation, data signal $130_0$ will be used rather than the entire data bus $130_7$-$130_0$. Based on the description below, a person skilled in the relevant art will recognize that embodiments or the present invention are equally applicable to data bus $130_7$-$130_0$.

Figure 5:
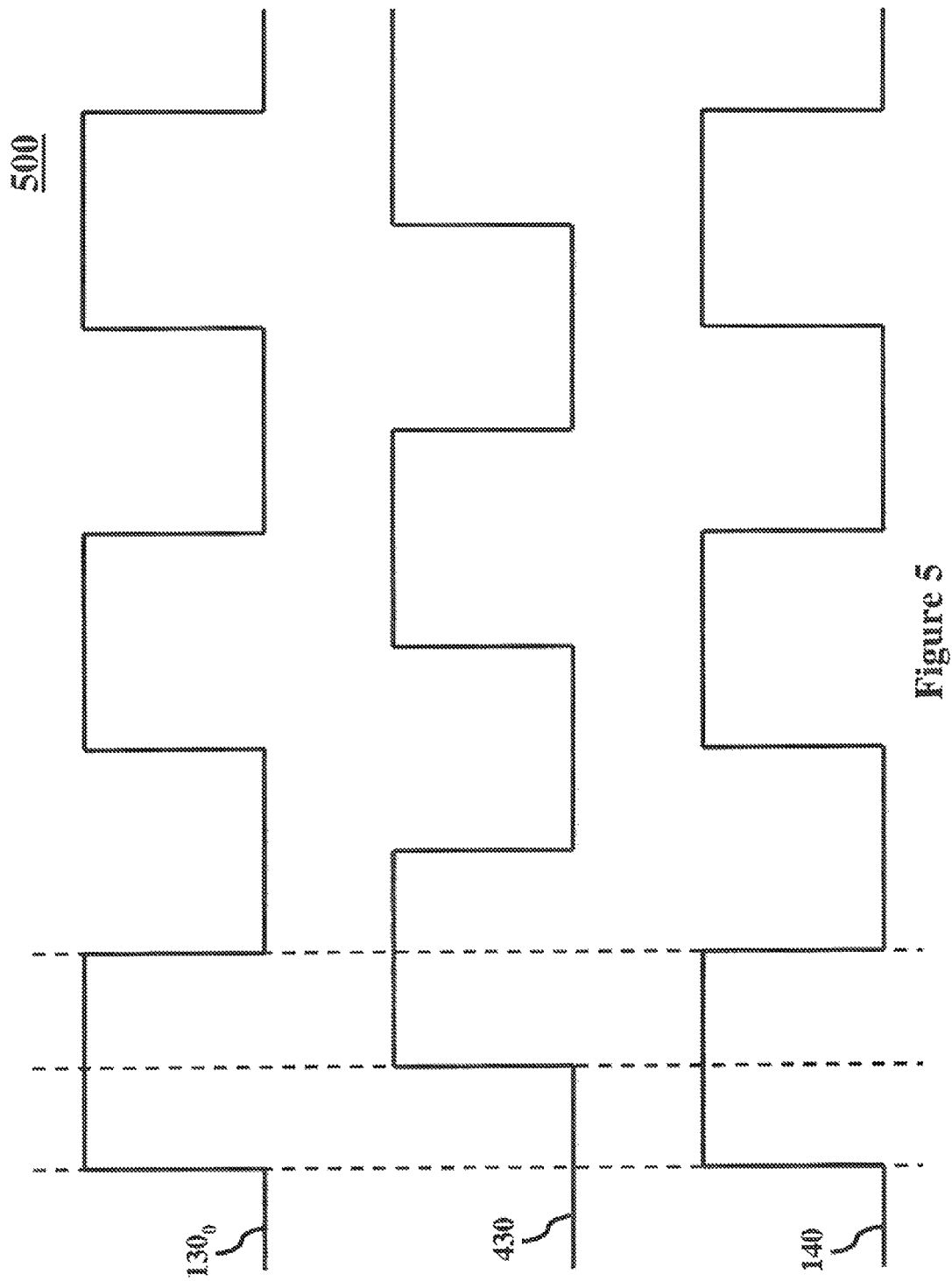
FIG. 5 is an illustration of an embodiment of a write timing diagram for a data signal, a reference signal, and a write clock.

FIG. 5 is an illustration of an embodiment of a write timing diagram for data signal $130_0$, reference signal 430, and write clock 140. In an embodiment, reference signal 430 is edge aligned to data signal $130_0$ and is a unidirectional signal. Further, in an embodiment, reference signal 430 has substantially the same data pattern as data signal such that reference signal 430 can be used to detect is phase shift in data signal $130_0$. In another embodiment, reference signal 430 has a clock-like pattern to maximize a number of data samples that can be used (e.g., number of detectable edge transitions in reference signal 430) to detect a phase shift in computer system 400. The detection of edge transitions in reference signal 430 is described further below. Based on the description herein, a person skilled in the relevant art will recognize that the data pattern of reference signal 430 can vary based on the design of communication system 400.

With respect to data signal $130_0$, reference signal 430 is phase shifted from data signal $130_0$ by one-half unit interval (UI) according to an embodiment of the present invention, where UI refers to a minimum time interval between a transition in data signal $130_0$ (e.g., a HIGH to LOW or a LOW to HIGH transition). In an instance where reference signal 430 is riot edge aligned to data signal $130_0$(e.g., reference signal 430 is center aligned to data signal $130_0$), data signal $130_0$ can shift up to one-half UI before reference signal 430 can be used to detect a phase shift in data signal $130_0$. Thus, in shifting reference signal one-half UI relative to data signal $130_0$, a phase shill in data signal $130_0$ can he detected with greater sensitivity (e.g., with a minimal phase shift in reference signal 430). Further, in an embodiment, write clock 140 is center aligned to data signal $130_0$. The relative phase shifts between data signal $130_0$, reference signal 430, and write clock 140 can be generated by PLL 415 and phase interpolators 411 and 413 (in FIG. 4), as known by those skilled in the relevant art. Thus, the relative phase shifts between data signal $130_0$, reference signal 430, and write clock 140 are introduced into each signal prior to a transmission of the signals from processing unit 410 to memory device 420.

In reference to FIG. 4, memory device 420 detects phase shifts in reference signal 430 based on a detection of one or more edge transitions in reference signal 430. In particular, phase interpolator 424 samples the buffered output from signal buffer 425 and detects a phase of the buffered output, where write clock 140 (via the output of buffer 427) is used as a clock to sample reference signal 430. The phase of reference signal 430 can he computed by detection of one or more edge transitions in reference signal 430. Over time, filter 423 compares the phase measurements (of reference signal 430) from phase interpolator 424 and computes a phase error signal. Methods and techniques to detect edge transitions of a signal, measure a phase of the signal, and compute a phase. error in the signal over time are known to those skilled in the relevant art.

The phase error signal from filter 423 can be used to adjust a relative phase difference between data signal $130_0$ and write clock 140 over time. In an embodiment, the phase error signal is fed into both phase interpolators 421 and 424. With respect to phase interpolator 421, the phase error signal can be used to introduce a phase delay in either data signal $130_0$ or write clock 140, or both data signal $130_0$ and write clock 140. For instance, in reference to FIG. 3, the phase error signal can he used to introduce a phase delay in write clock 140 such that write clock 140 is center aligned with respect to data signal $130_0$ (similar to write timing diagram 200 Of FIG. 2). In the alternative, the phase error signal can be used to introduce a phase delay in data signal $130_0$ such that data signal $130_0$ is center aligned to write clock 140. With respect to phase interpolator 424, in an embodiment, the phase error signal can be used to introduce a phase delay in write clock 140 to adjust the sampling of reference signal 430, thus creating a feedback mechanism between phase interpolator 424 and filter 423 to update the phase error signal over time. in yet another alternative, the phase error signal can be used to introduce a phase delay in both data signal $130_O$ and write clock 140 for timing alignment purposes as described above. Methods and techniques to introduce phase delays in write clock 140 and data signal $130_O$ are known to those skilled in the relevant art.

In summary, with respect to FIG. 4, memory device 420 samples reference signal 430 and generates a phase error signal based on phase shifts in reference signal 430 over time. This phase error signal can be used by phase interpolator 421 to delay either data signal $130_O$ or write clock 140, or both data signal $130_O$ and write dock 140, such that write clock 140 can he optimally aligned to data signal $130_O$ when used by phase interpolator 421 to sample data signal $130_O$.

Figure 6:
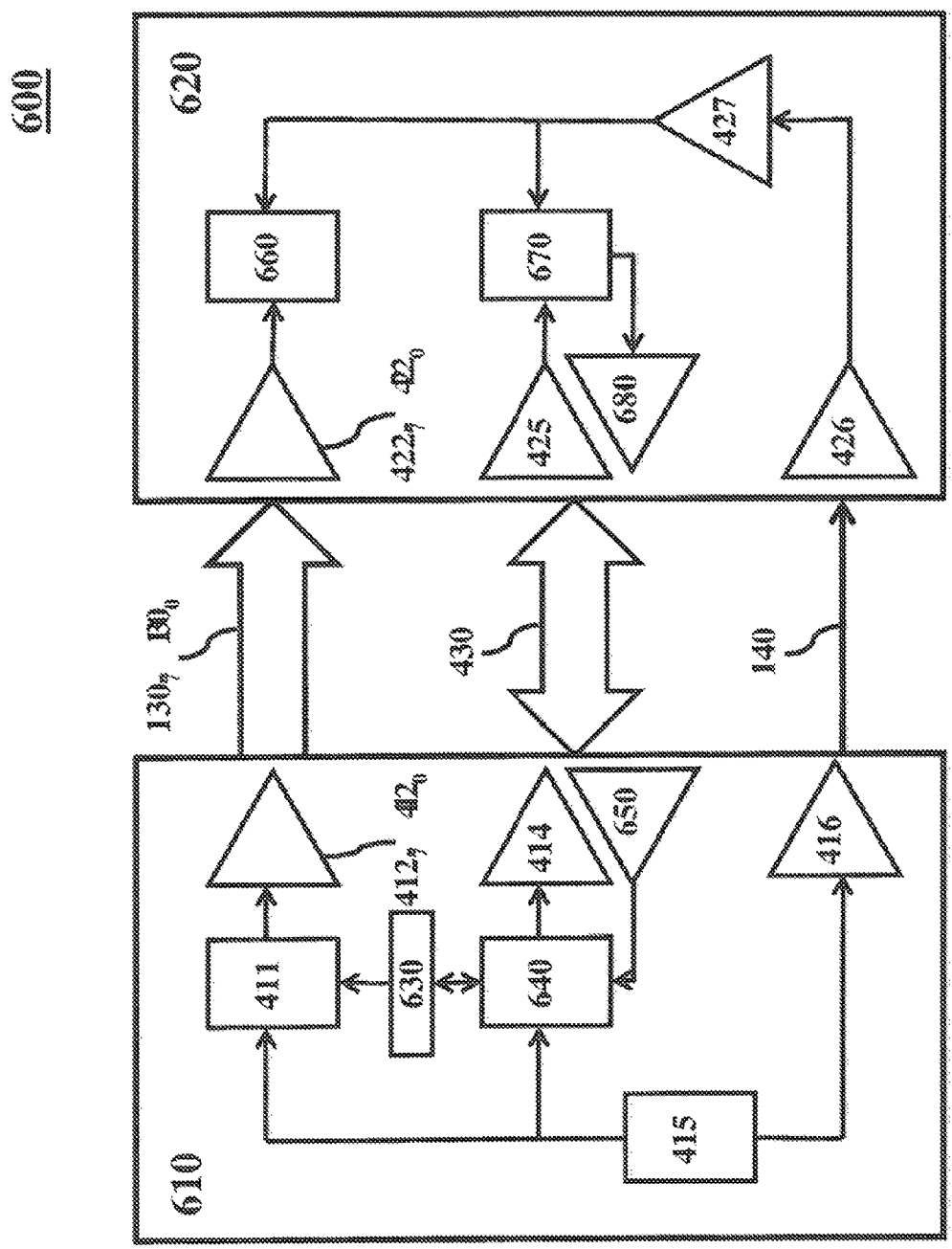
FIG. 6 is an illustration of another embodiment of a computer system configured to adjust a write timing in a memory device.

In another embodiment of the present invention, the phase error signal can be computed by a processing unit and applied to either data signal $130_O$ or write clock 140, or both data signal $130_O$ and write clock 140, prior to data signal $130_O$ or write clock 140 being transmitted to a memory device for a write operation. FIG. 6 is an illustration of another embodiment of a computer system 600 configured to adjust a write timing in a memory device. Computer system 600 includes a processing unit 610, a memory device 620, a reference signal 430, data bus $130_7$-$130_O$, and write clock 140.

Similar to computer system 400 of FIG. 4, in an embodiment, processing unit 610 and memory device 620 are IC devices on a circuit board with reference signal 430, data bus $130_7$-$130_O$, and write clock 140 communicatively coupling the two IC devices, where reference signal 430, data bus $130_7$-$130_O$, and write, clock 140 can he wires, interconnects, or circuit board traces. In another embodiment, processing unit 610 and memory device 620 are integrated on a single IC device with reference signal 430, data bus $130_7$-$130_O$, and write clock 140 communicatively coupling processing unit 610 to memory device 620.

In an embodiment, memory device 620 includes data buffers $422_7$-$422_O$, signal hollers 425 and 680, clock buffer 426, samplers 660 and 670, and buffer 427. Samplers 660 and 670 sample data bus $130_7$-$130_O$ and reference signal 410, respectively, where write clock 140 (via the output of buffer 427) is used as a clock to sample the signals. An example of samplers 660 and 670 is a latch, which is known to those skilled in the relevant art. Once sampler 670 samples reference signal 430, the sampled signal is transmitted back to processing unit 610 via signal buffer 680.

The sampled signal can be transmitted from memory device 620 to processing unit 610 via the same 110 ports used to transmit reference signal 430 from processing unit 610 to memory device 620, according to an embodiment of the present invention. If the same I/O ports are used to transmit the sampled signal from memory device 620 to processing unit 610, reference signal 430 is considered a bidirectional signal. Alternatively, in another embodiment, the sampled signal can be transmitted from memory device 620 to processing unit 610 via different I/O ports in processing unit 610 and memory device 620 from those I/O ports used to transmit reference signal 430 from processing unit 610 to memory device 620.

Upon receipt of the sampled signal from memory device 620, processing unit 610 processes the sampled signal in a similar manner as described above with respect to FIG. 4. In an embodiment, processing unit 610 includes filter 630, phase interpolators 411 and 640, data buffers $412_7$-$412_O$, signal buffers 414 and 650, clock buffer 416, and PLL 415. Processing unit 610 detects phase shills in the sampled reference signal from memory device 620. In particular, phase interpolator 640 receives the sampled from sampler 670) and buffered reference signal from signal buffer 650. From this buffered signal, phase interpolator 640 detects a phase of the buffered signal, where a clock output of PLL 415 is used as a clock to sample the buffered signal. Similar to FIG. 4, the phase of the buffered signal can be computed by detection of one or more edge transitions in the buffered signal. Over time, filter 630 compares the phase measurements from phase interpolator 640 and computes a phase error signal.

The phase error signal from filter 630 can be used to adjust a rdative phase between data signal $130_O$ and write clock 140. In an embodiment, the phase error signal is fed into phase interpolator 411. The phase error signal can be used to introduce a phase delay in either data signal $130_O$ or write clock 140, or both data signal $130_O$ and write clock 140. For instance, the phase error signal can be used to introduce a phase delay in write clock 140 such that write clock 140 is center aligned with respect to data signal $130_O$ when write clock 140 and data signal $130_O$ reach memory device 620. In the alternative, the phase error signal can be used to introduce a phase delay in data signal $130_O$ such that data signal $130_O$ is center aligned to write dock 140 at the time write clock 140 and data signal $130_O$ reach memory device 620. In yet another alternative, the phase error signal can be used to introduce a phase delay in both data signal $130_O$ and Write clock 140 for timing alignment purposes as described above.

In summary, with respect to FIG. 6, processing unit 610 samples reference signal 430 after reference signal 430 has traversed the signal path to and from memory device 620. In an embodiment, the phase error signal from filter 630 takes into account the complete signal path of reference signal 430 when introducing the phase delay in either data signal $130_O$ or write clock 140, or both data signal $130_O$ and write clock 140. The phase error signal can be used by phase interpolator 411 to delay either data signal $130_O$ or write clock 140, or both data signal $130_O$ and write clock 140, such that write clock 140 can be optimally aligned to data signal $130_O$ when used to sample data signal $130_O$ at memory device 620.

Figure 7:
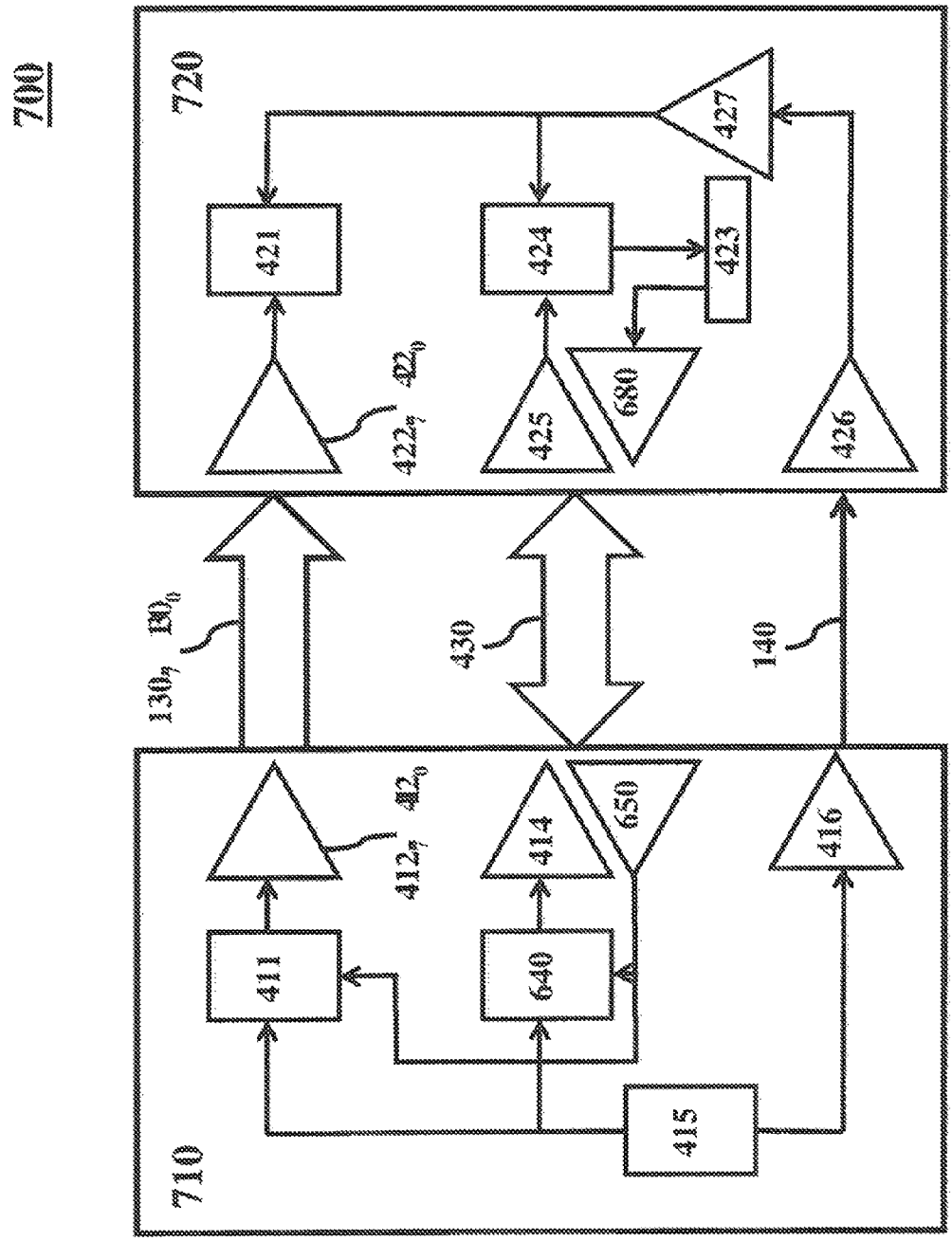
FIG. 7 is an illustration of another embodiment of a computer system configured to adjust a write timing in a memory device.

In yet another embodiment of the present invention, the phase error signal can be computed by a memory device and applied to either data signal $130_O$ or write dock 140, or both data signal $130_O$ and write clock 140, prior to data signal $130_O$ or write clock 140 being transmitted from a processing unit to the memory device for a write operation. FIG. 7 is an illustration of another embodiment of a computer system 700 configured to adjust a write, timing in a memory device. Computer system 700 includes as processing unit 710, as memory device 720, a reference signal 430. data bus $130_7$-$130_O$, and write clock 140.

Similar to memory device 420 of FIG. 4, memory device 720 detects phase shifts in reference signal 430 based on a detection of one or more edge transitions in reference signal 430. Memory device 720 includes phase interpolators 421 and 424, data buffers $422_7$-$422_O$, signal buffers 425 and 680, clock buffer 426, filter 423, and buffer 427. Phase interpolators 421 and 424, data buffers $422_7$-$422_O$, signal butler 425, clock buffer 426, filter 423, and buffer 427 operate in a similar manner as described above with respect to FIG. 4. Further, buffer 680 operates in a similar manner as described above with respect to FIG. 6.

Phase interpolator 424 samples the buffered input from signal buffer 425 and detects as phase of the buffered output, where write clock 140 (via the output of buffet 427) is used as a clock to sample reference signal 430. The phase of reference signal 430 can he computed by detection of one or more edge transitions in reference signal 430. Over time, filter 423 compares the phase measurements (of reference signal 430) from phase interpolator 424 and computes a phase error signal.

In an embodiment of the present invention, the phase error signal from filter 423 is transmitted from memory device 720 to processing unit 710 via signal buffer 680. Upon receipt of the phase error signal from memory device 720, processing unit 710 adjusts a relative phase difference between data signal 130$_O$ and write clock 140. In an embodiment, processing unit 710 includes phase interpolators 411 and 640, data buffers 412$_7$-412$_0$, signal buffers 414 and 650, clock buffer 416, and PLL 415. Phase interpolator 411, data buffers 412$_7$-412$_0$, signal buffer 414, clock buffer 416, and PLL 415 operate in a similar manner as described above with respect to FIG. 4. Further, phase interpolator 640 and signal buffer 650 operate in a similar manner as described above with respect to FIG. 6.

In an embodiment, phase interpolators 411 and 640 receive the phase error signal from memory device 720 via signal buffer 650. The phase error signal can be used to introduce a phase delay in either data signal 130$_O$ or write clock 140, or both data signal 130$_O$ and write clock 140. For instance, the phase error signal can be used to introduce a phase delay in write clock 140 such that write clock 140 is center aligned with respect to data signal 130$_O$ when write clock 140 and data signal 130$_O$ reach memory device 720. In the alternative, the phase error signal can be used to introduce a phase delay in data signal 130$_O$ such that data signal 130$_O$ is center aligned to write clock at the time write clock 140 and data signal 130$_O$ reach memory device 720. In yet another alternative, the phase error signal can be used to introduce a phase delay in both data signal 130$_O$ and write clock 140 for timing, alignment purposes as described above.

In summary, with respect to FIG. 7, memory device 720 samples reference signal 430 and generates a phase error signal based on phase shifts in reference signal 430 over time. This phase error signal can be transmitted from memory device 720 to processing unit 710 such that phase interpolators 411 and 640 (in processing unit 610) can use the phase error signal to delay either data signal 1300 or write clock 140, or both data signal 130$_O$ and write clock 140, such that write clock 140 can be optimally aligned to data signal 130$_O$ when used to sample data signal 130$_O$ at memory device 720.

Figure 8:
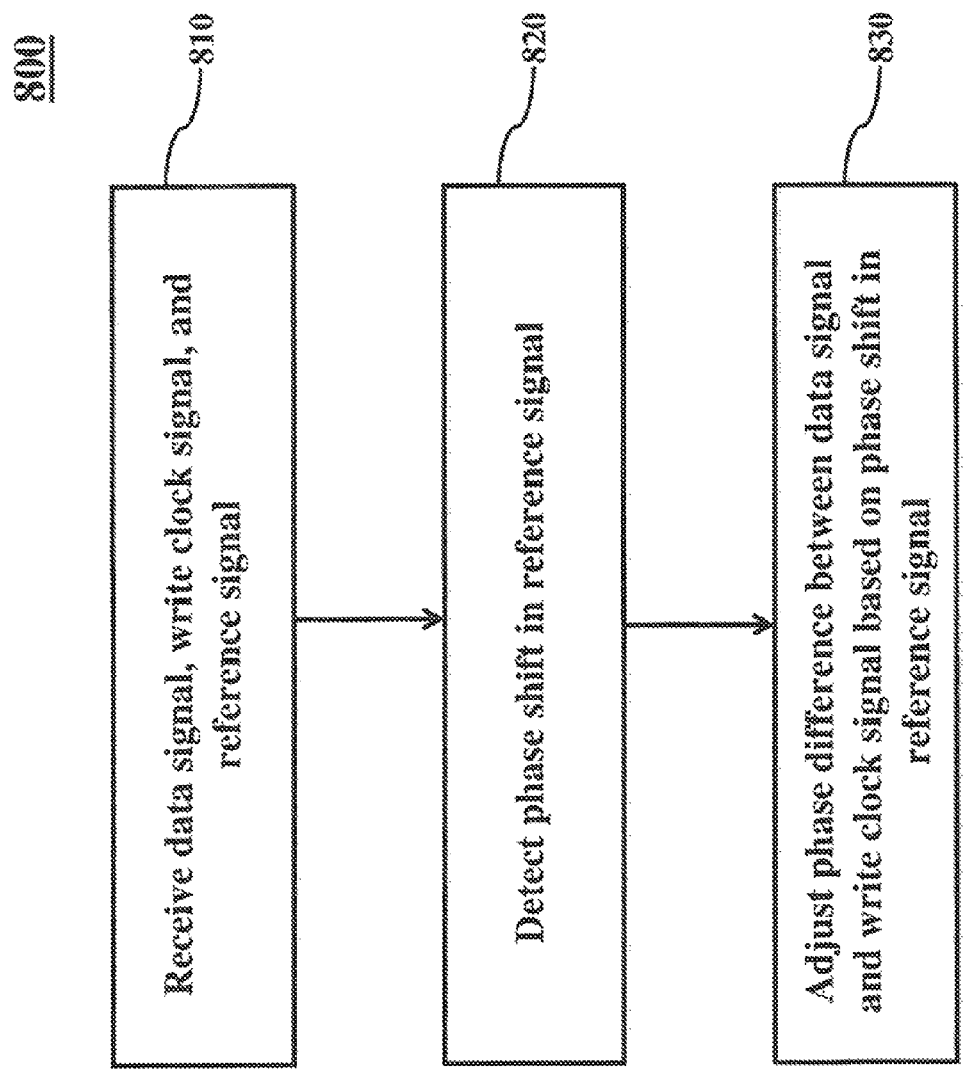
FIG. 8 is an illustration of an embodiment of a method for adjusting a write timing in a memory device.

FIG. 8 is an illustration of an embodiment of a method 800 for adjusting a write timing in a memory device. Method 800 can occur using, for example, computer system 400, computer system 600, or computer system 700. In step 810, a data signal, a write clock signal, and as reference signal are received by at memory device, such as memory device 420 and memory device 620 in FIGS. 4 and 6, respectively. In an embodiment, a data pattern of the reference signal is substantially similar to a data pattern of the data signal. Further, in an embodiment, the reference signal has a phase shift of one-half UI with respect to the data signal.

In step 820, a phase shift of the reference signal is detected. In an embodiment, the phase shift can be detected based on edge transitions in the reference signal, similar to the method described above with respect to FIG. 4. The phase of the reference signal can be computed based on the detection of one or more edge transitions in the reference signal, where the phase of the reference signal can shift over time. In an embodiment, the phase shift of the reference signal over time can be used to generate the phase difference, or phase error signal, of the reference signal.

In step 830, a phase difference between the data signal and the write clock signal is adjusted based on the phase shift detected in step 820 in adjusting the phase difference between the data signal and the write clock signal, a phase delay of either the data signal or the write clock signal can he adjusted such that the signals are center aligned to each other, In an embodiment, a phase delay of the write clock signal can be adjusted based on the phase shift detected in step 820 such that the data signal and the write clock signal are center aligned to each other. Alternatively, in another embodiment, a phase delay of the data signal can be adjusted based on the phase shift detected in step 820 such that the data signal and the write clock signal are center aligned to each other. In yet another embodiment, phase delays of both the data signal and the write clock signal can be adjusted based on the phase shift detected in step 820 such that the data signal and the write clock signal are center aligned to each other. Since the phase shift of the reference signal changes over time, the phase delay between the data signal and the write clock signal also changes over time.

Figure 9:
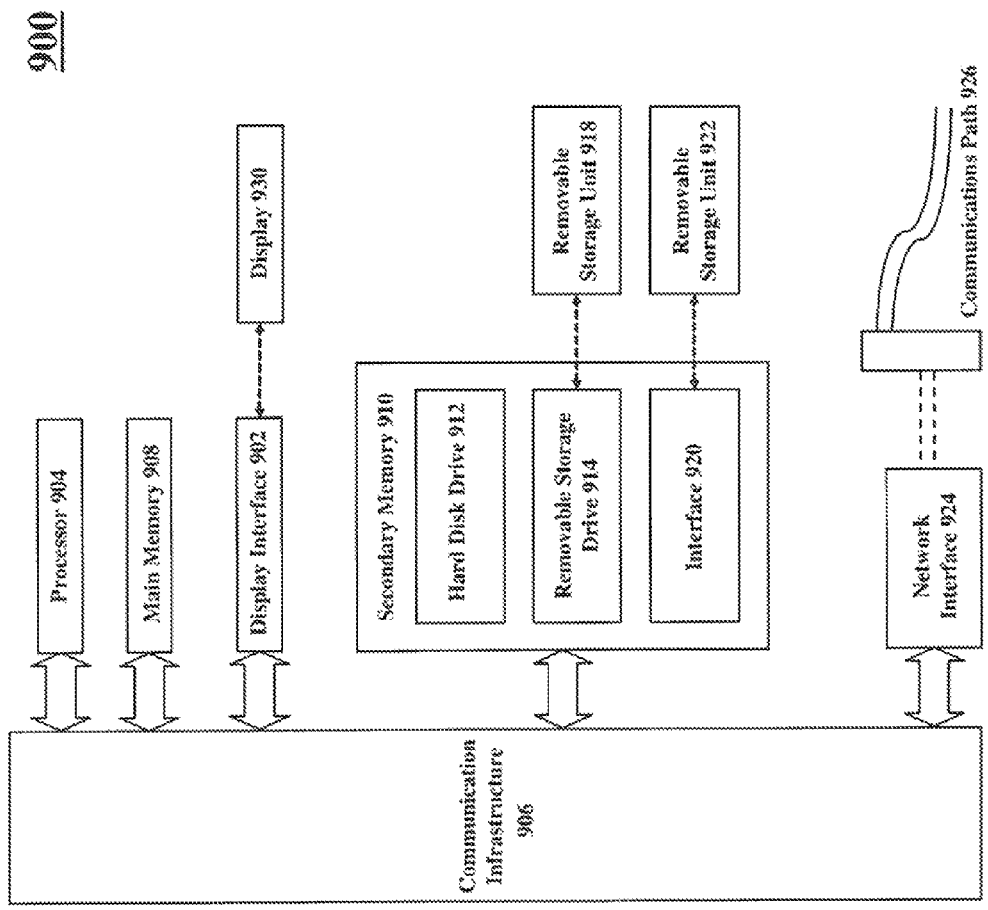
FIG. 9 is an illustration of an example computer system in which embodiments of the present invention can be implemented.

Various aspects of the present invention may be implemented in software, firmware, hardware, or a combination thereof. FIG. 9 is an illustration of an example computer system 900 in which embodiments of the present invention, or portions thereof, can be implemented as computer-readable code. For example, the method illustrated by flowchart 800 of FIG. 8 can be implemented in system 900. Various embodiments of the present invention are described in terms of this example computer system 900. After reading this description, it will become apparent to a person skilled in the relevant art how to implement embodiments of the present invention using other computer systems and/or computer architectures.

It should be noted that the simulation, synthesis and/or manufacture of various embodiments of this invention may be accomplished, in part, through the use of computer readable code, including general programming languages (such as C or C++), hardware description languages (HDL) such as, for example, Verilog HDL, VHDL, Altera HDL (AHDL), or other available programming and/or schematic capture tools (such as circuit capture tools). This computer readable code can be disposed in any known computer usable medium including a semiconductor, magnetic disk, optical disk (such as CD-ROM, DVD-ROM). As such, the code can be transmitted over communication networks including the internet. It is understood that the functions accomplished and/or structure provided by the systems and techniques described above can he represented in a core (such as is GPU core) that is embodied in program code. and can be transformed to hardware as part of the production of integrated circuits.

Computer system 900 includes one or more processors, such as processor 904. Processor 904 may be a special purpose or a general purpose processor. Processor 904 is connected to as communication infrastructure 906 (e.g., a bus or network).

Computer system 900 also includes a main memory 908, preferably random access memory (RAM), and may also include a secondary memory 910. Secondary memory 910 can include, for example, a hard disk drive 912, a removable storage drive 914, and/or a memory stick, Removable storage drive 914 can include a floppy disk drive, a magnetic tape drive, an optical disk drive, a flash memory, or the like. The removable storage drive 914 reads from and/or writes to a removable storage unit 918 in a well known manner. Removable storage unit 918 can comprise a floppy disk, magnetic tape, optical disk, etc. which is read by and written to by removable storage drive 914. As will be appreciated by persons skilled in the relevant art, removable storage unit 918 includes a computer-usable storage medium having stored therein computer software and/or data.

In alternative implementations, secondary memory 910 cart include other similar devices for allowing computer programs or other instructions to be loaded into computer system 900. Such devices can include, for example, a removable storage unit 922 and an interface 920. Examples of such devices can include a program cartridge and cartridge interface (such as those found in video game devices), a removable memory chip (e.g., EPROM or PROM) and associated socket, and other removable storage units 922 and interfaces 920 which allow software and data to be transferred from the removable storage unit 922 to computer system 900.

Computer system 900 can also include a communications interface 924. Communications interface 924 allows software and data to be transferred between computer system 900 and external devices. Communications interface 924 can include a tandem, a network interface such as an Ethernet card), a communications port, a PCMCIA slot and card, or the like. Software and data transferred via communications interface 924 are in the form of signals which may be electronic, electromagnetic, optical, or other signals capable of being received by communications interlace 924. These signals are provided to communications interface 924 via a communications path 926. Communications path 926 carries signals and can be implemented using wire or cable, fiber optics, a phone line, a cellular phone link, a RF link or other communications channels.

In this document, the terms "computer program medium" and "computer-usable medium" are used to generally refer to media such as removable storage unit 918, removable storage unit 922, and a hard disk installed in hard disk drive 912. Computer program medium and computer-usable medium can also refer to memories, such as main memory 908 and secondary memory 910, which can be memory semiconductors (e.g., DRAMs, etc.). These computer program products provide software to computer system 900.

Computer programs also called computer control logic) are stored in main memory 908 and/or secondary memory 910. Computer programs may also be received via communications interface 924. Such computer programs, when executed, enable computer system 900 to implement embodiments of the present invention as discussed herein. In particular, the computer programs, when executed, enable processor 904 to implement processes of embodiments of the present invention, such as the steps in the methods illustrated by flowchart 800 of FIG. 8, discussed above. Accordingly, such computer programs represent controllers of the computer system 900. Where embodiments of the present invention are implemented using software, the software can be stored in a computer program product and loaded into computer system 900 using removable storage drive 914, interface 920, bard drive 912, or communications interface 924.

Embodiments of the present invention are also directed to computer program products including, software stored on any computer-usable medium. Such software. when executed in one or more data processing, device, causes a data processing device(s) to operate as described herein.

Embodiments of the present invention employ any computer-usable or -readable medium, known now or in the future. Examples of computer-usable mediums include, but are not limited to, primary storage devices (e.g., any typo of random access memory), secondary storage devices (e.g., bard drives, floppy disks, CD ROMS, ZIP disks, tapes, magnetic storage devices, optical storage devices, MEMS, nanotochnological storage devices, etc.), and communication mediums (e.g., wired and wireless communications networks, local area networks, wide area networks, intranets, etc.).

While various embodiments of the present invention have been described above, it should be understood that they have been presented by way of example only, and not it will be understood by persons skilled in the relevant art that various changes in form and details can be made therein without departing from the spirit and scope of the invention as defined in the appended claims, it should be understood that the invention is not limited to these examples. The invention is applicable to any elements operating as described herein. Accordingly, the breadth and scope of the present invention should not be limited by any of the above-described exemplary embodiments, but should be defined only in accordance with the following claims and their equivalents.

What is claimed is:

1. A method for adjusting a write timing in a memory device, comprising:
   sending a data signal, a write clock signal, and a reference signal to the memory device;
   receiving a sampled reference signal from the memory device;
   computing phase measurements of the sampled reference signal over a period of time;
   comparing the computed phase measurements of the sampled reference signal over the period of time;
   computing a phase error signal based on the compared phase measurements; and
   adjusting a phase difference between the data signal and the write clock signal based on the phase error signal, the adjusting comprising:
   sampling the sampled reference signal;
   detecting a phase of the sampled reference signal; and
   comparing the phase of the sampled reference signal over the period of time to adjust the phase difference.

2. The method of claim 1, wherein detecting the phase of the sampled reference signal comprises detecting one or more edge transitions in the reference signal.

3. The method of claim 2, wherein comparing the phase of the sampled reference signal comprises computing a phase measurement of the reference signal based on the detection of the one or more edges transitions.

4. A system configured to adjust a writing timing in a memory device, the system comprising:
   a memory including a first buffer to receive a reference signal from a processing unit;
   the memory device configured to receive a data signal, and a write clock signal;
   the memory including a sampler device configured to sample the reference signal, wherein the write clock signal is used to sample an output;
   the memory device configured to recover data from the data signal based on a write timing of the data signal and the write clock signal;
   the memory device configured to compute phase measurements of the sampled reference signal over a period of time;

the memory device configured to compare the computed phase measurements of the sampled reference signal over the period of time; and the memory device configured to generate a phase shift based on the compared phase measurements over the period of time; and a processing unit configured to:
  transmit the data signal, write clock signal, and the reference signal to the memory device;
  receive the sampled reference signal from a second buffer in the memory device;
  compute a phase error signal based on the compared phase measurements and the phase shift; and
  adjust a phase difference between the data signal and the write clock signal based on the phase error signal.

5. A system configured to adjust a write timing in a memory device, comprising:

a processing unit configured to transmit a data signal, a write clock signal, and a reference signal to multiple buffers in a memory device;

the memory device configured to recover data from the data signal based on a write timing of the data signal and the write clock signal;

a sampling device in the memory device configured to sample the reference signal; and a second buffer in the memory device configured to transmit, to the processing unit, information corresponding to a phase difference between the data signal and the write clock signal based on computed phase measurements of the sampled reference signal over a period of time and a phase shift based on compared phase measurements of the computed phase measurements.

6. The system of claim 5, wherein the processing unit is configured to adjust a phase difference between the data signal and the write clock signal based on the information transmitted from the memory device.

* * * * *